United States Patent [19]
Ito et al.

[11] Patent Number: 5,840,374
[45] Date of Patent: *Nov. 24, 1998

[54] METHOD OF FORMING A SIO₂ PASSIVATION FILM ON A PLASTIC SUBSTRATE

[75] Inventors: Kazuyuki Ito; Kyuzo Nakamura; Michio Ishikawa; Jun Togawa; Noriaki Tani; Masanori Hashimoto, all of Chiba-ken; Yumiko Ohashi, Nagoya, all of Japan

[73] Assignees: Nihon Shinku Gijutsu Kabushiki Kaisha, Kanagawa-ken; Brother Kogyo Kabushiki Kaisha, Aichi-ken, both of Japan

[ * ] Notice: This patent issued on a continued prosecution application filed under 37 CFR 1.53(d), and is subject to the twenty year patent term provisions of 35 U.S.C. 154(a)(2).

[ * ] Notice: The term of this patent shall not extend beyond the expiration date of Pat. No. 5,554,418.

[21] Appl. No.: 661,500

[22] Filed: Jun. 11, 1996

Related U.S. Application Data

[63] Continuation-in-part of Ser. No. 310,760, Sep. 27, 1994, Pat. No. 5,554,418.

[30] Foreign Application Priority Data

Dec. 28, 1993 [JP] Japan ..................................... 5-335714

[51] Int. Cl.⁶ ............................... B05D 3/06; C23C 16/22
[52] U.S. Cl. .......................... 427/579; 427/573; 427/574; 427/578; 427/255.3; 427/255.2; 427/255.1; 438/789

[58] Field of Search ..................................... 427/579, 573, 427/574, 578, 255.3, 255.2, 255.1, 419.3; 437/238; 438/789

[56] References Cited

U.S. PATENT DOCUMENTS

| 4,708,884 | 11/1987 | Chandross et al. | 427/579 |
|---|---|---|---|
| 4,894,352 | 1/1990 | Lane et al. . | |
| 5,037,514 | 8/1991 | Yamazaki | 427/578 |
| 5,266,525 | 11/1993 | Morozumi | 438/624 |
| 5,271,972 | 12/1993 | Kwok et al. . | |
| 5,364,666 | 11/1994 | Williams et al. . | |
| 5,514,624 | 5/1996 | Morozumi | 438/624 |
| 5,571,571 | 11/1996 | Musaka et al. | 427/574 |
| 5,643,838 | 7/1997 | Dean et al. | 438/789 |

OTHER PUBLICATIONS

Pierson et al, "Handbook of Chemical Vapor Deposition (CVD) Principles, Technology and Applications", Noyes Publications, 1992, pp. 101–103.

Hugh O. Pierson, "Handbook of Chemical Vapor Depostion (CVD), Principles, Technology and Applications", 1992, pp. 231–234.

*Primary Examiner*—Roy Ven King
*Attorney, Agent, or Firm*—Armstrong, Westerman, Hattori, McLeland & Naughton

[57] ABSTRACT

An SiO₂ passivation film is formed on a surface of a substrate made of a plastic material by plasma chemical vapor deposition (CVD) process in which organic oxysilane is used as a raw gas. Instead of a reactive gas having an ashing effect, Ar, He or NH₃ is used as a reactive gas which serves as an auxiliary for decomposing the raw gas at a temperature not greater than a temperature at which the substrate is thermally deformed (i.e., about 250° C.). The ashing of the substrate by oxygen or hydrogen radicals is thus prevented.

6 Claims, 1 Drawing Sheet

METHOD OF FORMING A SIO$_2$ PASSIVATION FILM ON A PLASTIC SUBSTRATE

The present application is a continuation-in-part of prior U.S. patent application Ser. No. 08/310,760, filed Sep. 27, 1994 now U.S. Pat. No. 5,554,418.

BACKGROUND OF THE INVENTION

1. Field of the Invention

The present invention relates to a method of forming a passivation film or a protection film and, in particular, to a method of forming a passivation film of SiO$_2$ (silicic acid anhydride) on a substrate made of a resinous material or a plastic material.

2. Description of Related Art

As a surface protection film (i.e., a passivation film) to be formed on a resinous material or a plastic material, attention has recently been paid to SiO$_2$ and its applications are being expanded. In addition, a passivation film of silicic acid anhydride of superior quality is desired.

As a method of forming a passivation film of SiO$_2$ on a substrate of a resinous material or a plastic material, there has hitherto been used a vapor deposition process, a sputtering process, or the like. However, this kind of conventional method has a disadvantage in that, when the surface of the substrate of the resinous material or the plastic material has irregularities in the form of projections and recesses, or curved surface, the adhesion of the SiO$_2$ film to the surface of the substrate or, in other words, the characteristics of adhesion of the SiO$_2$ film onto the irregularly shaped portions or step coverage is poor.

As a solution to this disadvantage, there has been used a plasma CVD (Chemical Vapor Deposition) process as a method of improving the adhesion of the SiO$_2$ film to the surface of the substrate or step coverage and of forming an SiO$_2$ film of superior quality.

In order to form the SiO$_2$ film on the surface of the substrate by the plasma CVD process, it is necessary to use an oxidizing gas such as O$_2$, N$_2$O or the like. This plasma CVD process has however the following problem. Namely, the substrate that is made of a resinous material or a plastic material is subjected to ashing by the radicals of the oxidizing gas. As a result, the surface of the substrate is roughened into a rough surface. In case the surface of the substrate has irregularities in the form of projections and recesses or is curved, its shape is remarkably or largely deformed, with the result that the SiO$_2$ passivation film of uniform thickness in conformity to the shape of the surface of the substrate cannot be formed.

Therefore, it has long been desired to establish a method of forming an SiO$_2$ passivation film of good quality on a substrate without subjecting the substrate to ashing.

SUMMARY OF THE INVENTION

In order to attain the above-described object, the present invention is a method of forming an SiO$_2$ passivation film on a surface of a substrate by plasma chemical vapor deposition (CVD) process in which organic oxysilane is used as a raw gas. The method comprises using, at a temperature not greater than one thermally deforming the substrate instead of a reactive gas having an ashing effect, a gas selected from the group consisting of Ar, He and NH$_3$ as a reactive gas which serves as an auxiliary for decomposing the raw gas, whereby ashing of the substrate by oxygen or hydrogen radicals is prevented.

The temperature not greater than one thermally deforming the substrate is about 250° C. or lower, preferably about 150° C. or lower.

The reactive gas may be added thereto one of fluorine group gases of CF$_4$ and NF$_3$.

Namely, according to the present invention, in the plasma CVD process using organic oxysilane such as TEOS (tetraethoxysilane or tetraethyl orthosilicate: Si(OC$_2$H$_5$)$_4$), a gas such as Ar, He or NH$_3$ is used instead of a reactive gas having an ashing effect such as an oxidizing gas of O$_2$, N$_2$O or the like or H$_2$ gas at an initial stage of film formation. By this arrangement, an SiO$_2$ film can be formed with good adhesion or good step coverage without ashing the surface of the resin material or plastic material which serves as the substrate.

Further, if there is added a fluorine group gas such as CF$_4$, NF$_3$ or the like which accelerates the decomposition reaction of —CH radicals, —OH radicals or the like from the organic oxysilane to be used as the raw gas, the speed of film formation can be increased, without the surface of the substrate being subjected to ashing.

When a passivation film of SiO$_2$ is formed on the surface of the substrate of a resinous material or a plastic material by plasma CVD process by using organic oxysilane, if an oxidizing gas such as O$_2$, N$_2$O or the like is used, the film formation is carried out by decomposing the organic oxysilane mainly by oxygen radicals and further compensating the oxygen atoms which come short at the time of decomposition.

In this case, there will be present a large amount of oxygen radicals in the gaseous phase, with the result that the surface of the resinous material or the plastic material as the substrate is subjected to ashing.

The substrate is also subjected to ashing by hydrogen radicals when H$_2$ is used.

If one of the gases of Ar, He and NH$_3$ is used instead of an oxidizing gas such as O$_2$, N$_2$O or the like, or a reactive gas such as H$_2$, a more effective decomposition of —CH radicals, —OH radicals or the like from the organic oxysilane is carried out by the radicals, ions, or the like of such a gas. As a result, the generation of O$_2$ radicals and H$_2$ radicals, both having an ashing effect, can largely be decreased, thereby preventing the ashing of the substrate.

Further, if a fluorine group gas such as CF$_4$, NF$_3$ or the like is added, —CH radicals, —OH radicals, —H radicals or the like of organic oxysilane as the raw gas are selectively decomposed. In this manner, the speed of film formation can be increased while preventing the ashing of the substrate.

BRIEF DESCRIPTION OF THE DRAWINGS

The above and other objects and the attendant advantages of the present invention will become readily apparent by reference to the following detailed description when considered in conjunction with the accompanying drawings wherein.

DETAILED DESCRIPTION OF PREFERRED EMBODIMENTS

As a substrate on which a passivation film of $SiO_2$ is formed, there can be listed a plastic material such as an epoxy resin, polycarbonate resin, ABS resin, acrylic resin or the like.

As an apparatus to be used in carrying out a plasma CVD process for forming the $SiO_2$ film on the surface of a substrate, there can be listed a capacity coupling type apparatus and an inductive coupling type apparatus.

As an organic oxysilane to be used as a raw gas, there can be listed TMOS (tetramethoxysilane or tetramethyl orthosilicate: $Si(OCH_3)_4$), siloxane aside from TEOS (tetraethoxysilane or tetraethyl orthosilicate: $Si(OC_2H_5)_4$).

As a fluorine group gas to be added to a reactive gas of Ar, He or $NH_3$, there can be listed $CF_4$, $NF_3$ or the like. The amount of addition of the fluorine group gas may be from 0% to about 20% by volume from the viewpoint of manufacturing cost.

The temperature at which an $SiO_2$ passivation film is formed on the surface of the substrate may be selected within such a range that the substrate made of a plastic material such as an epoxy resin, polycarbonate resin, ABS resin, acrylic resin or the like is not thermally deformed.

Specific embodying examples of the present invention will now be explained together with a comparative example.

EXAMPLE 1

This is an example for forming a passivation film by plasma CVD process in the presence of TEOS (tetraethoxysilane or tetraethyl orthosilicate: $Si(OC_2H_5)_4$) and Ar gas.

As a substrate there was used an epoxy resin which has on its surface projections which are square in cross section, each projection being 0.3 mm wide and 0.3 mm high with a distance of 0.6 mm therebetween. As an organic oxysilane for a raw gas, there was used TEOS. Ar gas was used as a reactive gas which serves as an auxiliary for decomposing the raw gas. A parallel plate type apparatus was used as the plasma CVD apparatus. A passivation film of $SiO_2$ was formed on the substrate by introducing the raw gas under the conditions in which the internal pressure of the apparatus was 100 Pa, the partial pressure of Argon was 90 Pa, and 1000 V was applied as a high-frequency power source. The speed of forming the film was 40 nm/min. The temperature for forming the passivation film was 150° C.

Upon checking the surface of the substrate after the film formation, an $SiO_2$ film was found to have been formed uniformly on the surface of the substrate to a thickness of 2 $\mu$m without the surface of the substrate being subjected to ashing.

Figure 1A:
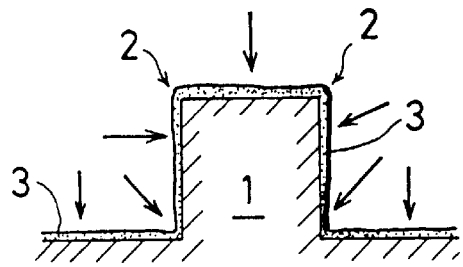
FIGS. 1A and 1B are schematic views showing a process of film formation of a passivation film on the surface of a substrate according to a first example of the present invention.
Figure 1B:
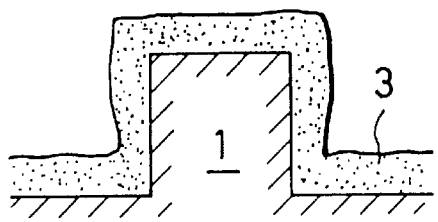

The process of forming the passivation film of $SiO_2$ on the surface of the substrate is shown in FIGS. 1(A) and 1(B).

First, as shown in FIG. 1(A), radicals 2 (shown by arrows) that were generated in the presence of TEOS and Ar reached the surface of the substrate 1. Formation of the passivation film 3 consisting essentially of $SiO_2$ immediately started on the surface of the substrate 1 by means of the radicals 2.

When the film forming step was continued for a predetermined period of time, there was attained a condition as shown in FIG. 1(B) in which the passivation film 3 of $SiO_2$ was formed smoothly to a uniform thickness on the surface of the substrate 1.

EXAMPLE 2

This is an example for forming an initial or preliminary passivation film by plasma CVD process in the presence of TEOS and Ar gas and then a passivation film by plasma CVD process in the presence of TEOS and $O_2$ gas.

As a substrate there was used an epoxy resin which has on its surface square projections which are square in cross section, each projection being 0.3 mm wide and 0.3 mm high with a distance of 0.6 mm therebetween. As an organic oxysilane for the raw gas, there was used TEOS. Argon gas was used as a reactive gas which serves as an auxiliary for decomposing the raw gas. A parallel plate type apparatus was used as the plasma CVD apparatus. An initial passivation film of $SiO_2$ of 200 nm thick was formed on the surface of the substrate by introducing the raw gas under the conditions in which the internal pressure of the apparatus was 100 Pa, the partial pressure of Ar gas was 90 Pa, and 1000 V was applied as a high-frequency power source.

Subsequently, a latter or remaining passivation film was formed on top of the initial passivation film by plasma CVD process under conditions of introducing $O_2$ gas, in place of Ar gas, at a partial pressure of 90 Pa. The speed of forming the initial passivation film was 40 nm/min and the speed of forming the latter passivation film was 40 nm/min. The temperature for forming the passivation films was 150° C.

Upon checking the surface of the substrate after the film formation, a passivation film of $SiO_2$ was found to have been formed on the surface of the substrate to a thickness of 2 $\mu$m without the surface of the substrate being subjected to ashing.

Figure 2A:
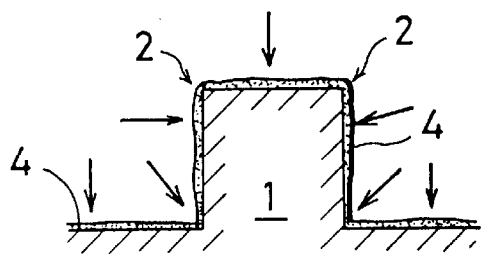
FIGS. 2A, 2B and 2C are schematic views showing a process of film formation of a passivation film on the surface of a substrate according to another example of the present invention.
Figure 2B:
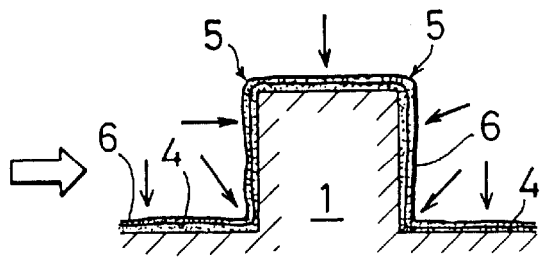
Figure 2C:
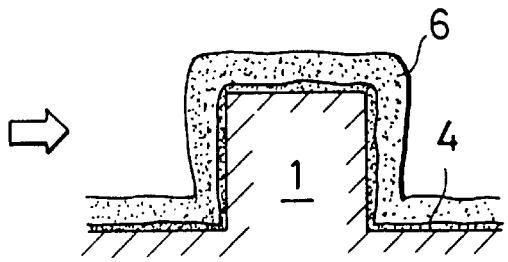

The process of forming the passivation film of $SiO_2$ on the surface of the substrate is shown in FIGS. 2(A) through 2(C).

As shown in FIG. 2(A), radicals 2 (shown by arrows) that were generated in the presence of TEOS and Ar gas first reached the surface of the substrate 1, and the formation of the initial passivation film 4 consisting essentially of $SiO_2$ on the surface of the substrate 1 immediately started by means of the radicals 2.

When the film forming was performed for a predetermined period of time, there was attained a condition, as shown in FIG. 2(B), in which the initial passivation film 4 of $SiO_2$ was smoothly formed on the surface of the substrate 1 to a uniform thickness.

Subsequently, when $O_2$ gas as a reactive gas was introduced in place of Ar gas, radicals 5 (shown by arrows) generated in the presence of TEOS and $O_2$ gas reached the surface of the initial passivation film 4 and the formation, on top thereof, of the passivation film 6 consisting essentially of $SiO_2$ immediately started by means of the radicals 5.

When the film formation was performed for a predetermined period of time, a condition was attained, as shown in FIG. 2(C), in which the passivation film 6 of $SiO_2$ in the presence of TEOS and $O_2$ gas was smoothly formed to a uniform thickness on top of the initial passivation film 4 (in the presence of TEOS and Ar gas) on the surface of the substrate 1.

In the above-described Example 2, an example was given of forming an initial or preliminary passivation film by plasma CVD process in the presence of TEOS and Ar gas and then a passivation film by plasma CVD process in the presence of TEOS and $O_2$ gas. The passivation film may also be formed by plasma CVD process in the presence of TEOS and $O_3$ gas.

Comparative Example 1

This is a comparative example for forming a passivation film by a conventional plasma CVD process in the presence of TEOS and $O_2$ gas.

As a substrate there was used an epoxy resin which has on its surface projections which are square in cross section, each projection being 0.3 mm wide and 0.3 mm high with a distance of 0.6 mm therebetween. As an organic oxysilane for the raw gas, there was used TEOS. $O_2$ gas was used as a reactive gas which serves as an auxiliary for decomposing the raw gas. A parallel plate type apparatus was used as the plasma CVD apparatus. A passivation film of $SiO_2$ was formed on the surface of the substrate by introducing the raw gas under conditions in which the internal pressure of the apparatus was 100 Pa, the partial pressure of $O_2$ was 90 Pa, and 1000 V was applied as a high-frequency power source. The speed of forming the film was 40 nm/min.

Upon checking the surface of the substrate after the film formation, the surface of the substrate was found to have been subjected to ashing into a rough surface with projections and depressions. The projections remained projected as if they were subjected to landslide. In addition, the thickness of the passivation film that was formed on the surface of the substrate was not uniform.

Figure 3A:
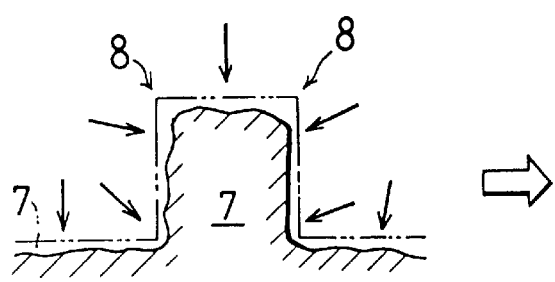
FIGS. 3A and 3B are schematic views showing a process of film formation of a passivation film on the surface of a substrate according to a conventional method.
Figure 3B:
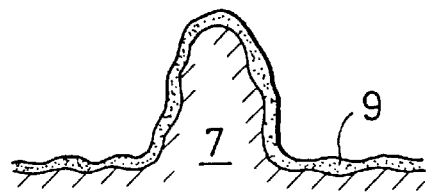

The process of forming the passivation film of $SiO_2$ on the surface of the substrate is shown in FIGS. 3(A) and 3(B).

As shown in FIG. 3(A), when the radicals 8 (shown by arrows) that were generated in the presence of TEOS and $O_2$ gas reached the surface (shown by an imaginary line) of the substrate 7, the surface of the substrate 7 was deformed through ashing by the oxygen radicals. Also there started the formation of the passivation film consisting essentially of $SiO_2$ on the deformed surface of the substrate 7 by the radicals 8 that were generated in the presence of TEOS and $O_2$ gas.

When the film formation was performed for a predetermined period of time, the surface of the substrate 7 was largely ashed as shown in FIG. 3(B) and became a condition in which the passivation film 9 of $SiO_2$ was slightly formed on the ashed surface of the substrate 7.

As can be clearly seen from the results of the Examples 1 and 2 and Comparative Example 1, it has been confirmed in the Examples of the present invention that a passivation film of $SiO_2$ of good quality can be smoothly formed to a uniform thickness in conformity with the shape of the substrate. It follows that the method of the present invention is superior in step coverage or characteristics or properties in coating irregularly shaped or stepped portions.

EXAMPLE 3

This is an example for forming a passivation film by plasma CVD process in the presence of TEOS and He gas.

The passivation film of $SiO_2$ was formed on the surface of the substrate in the same manner as in the Example 1 except for the fact that He gas was used as the reactive gas and that the partial pressure of He was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of forming the film was 38 nm/min.

EXAMPLE 4

This is an example for forming a passivation film by plasma CVD process in the presence of TEOS and $NH_3$ gas.

The passivation film of $SiO_2$ was formed on the surface of the substrate in the same manner as in the Example 1 except for the fact that $NH_3$ gas was used as the reactive gas and that the partial pressure of $NH_3$ was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation was 38 nm/min.

EXAMPLE 5

This is an example for forming a passivation film by plasma CVD process in the presence of TEOS, Ar and $CF_4$ gas.

The passivation film of $SiO_2$ was formed on the surface of the substrate in the same manner as in the Example 1 except for the fact that a mixture gas obtained by adding 5% by volume of $CF_4$ gas to Ar gas was used as the reactive gas and that the partial pressure of the mixture gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation was 50 nm/min.

By adding $CF_4$ gas to the reactive gas (Ar) as in the present Example, the speed of film formation (50 nm/min) can be increased as compared with the film formation speed (40 nm/min) in an example (Example 1) in which only Ar gas was used as the reactive gas.

EXAMPLE 6

This is an example for forming a passivation film by plasma CVD process in the presence of TEOS, He gas and $NF_3$ gas.

The passivation film of $SiO_2$ was formed on the surface of the substrate in the same manner as in the Example 1 except for the fact that a mixture gas obtained by adding 5% by volume of $NF_3$ gas to He gas was used as the reactive gas and that the partial pressure of the mixture gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation was 50 nm/min.

EXAMPLE 7

This is an example for forming an initial passivation film by plasma CVD process in the presence of TEOS and Ar gas and then forming thereon a passivation film by plasma CVD process in the presence of TEOS and $N_2O$ gas.

The latter passivation film of $SiO_2$ was formed on the surface of the initial passivation film which was on the surface of the substrate in the same manner as in the Example 2 except for the fact that $N_2O$ gas was used as the reactive gas and that the partial pressure of the $N_2O$ gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation of the initial passivation film was 40 nm/min and that of the latter passivation film was 40 nm/min.

EXAMPLE 8

This is an example for forming first an initial passivation film by plasma CVD process in the presence of TEOS and He gas and then forming thereon a passivation film by plasma CVD process in the presence of TEOS and $H_2$ gas.

After having formed the initial passivation film of $SiO_2$ on the surface of the substrate, the latter passivation film of $SiO_2$ was formed on the surface of the initial passivation film in the same manner as in the above-described Example 2 except for the fact that He gas was used as the reactive gas for forming the initial passivation film, that the partial pressure of the He gas was made to be 90 Pa, that $H_2$ gas was used as the reactive gas for forming the latter passivation film, and that the partial pressure of the $H_2$ gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation of the initial protection film was 40 nm/min and that of the latter protection film was 40 nm/min.

EXAMPLE 9

This is an example for forming first an initial passivation film by plasma CVD process in the presence of TEOS, $NH_3$ gas and $CF_4$ gas and then forming thereon a passivation film by plasma CVD process in the presence of TEOS and $O_2$ gas.

After having formed the initial passivation film of $SiO_2$ on the surface of the substrate, the latter passivation film of $SiO_2$ was formed on the surface of the initial passivation film in the same manner as in the above-described Example 2 except for the fact that a mixture gas obtained by adding 5% by volume of $CF_4$ gas to $NH_3$ gas was used as the reactive gas for forming the initial passivation film, that the partial pressure of the mixture gas was made to be 90 Pa, that $O_2$ gas was used as the reactive gas for forming the latter passivation film, and that the partial pressure of the $O_2$ gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation of the initial protection film was 50 nm/min and that of the latter protection film was 40 nm/min.

EXAMPLE 10

This is an example for forming first an initial passivation film by plasma CVD process in the presence of TEOS, He gas and $NF_3$ gas and then forming thereon a passivation film by plasma CVD process in the presence of TEOS and $H_2$ gas.

After having formed the initial passivation film of $SiO_2$ on the surface of the substrate, the latter passivation film of $SiO_2$ was formed on the surface of the initial passivation film in the same manner as in the above-described Example 2 except for the fact that a mixture gas obtained by adding 5% by volume of $NF_3$ gas to He gas was used as the reactive gas for forming the initial passivation film, that the partial pressure of the mixture gas was made to be 90 Pa, that $H_2$ gas was used as the reactive gas for forming the latter passivation film, and that the partial pressure of the $H_2$ gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation of the initial protection film was 50 nm/min and that of the latter protection film was 40 nm/min.

EXAMPLE 11

This is an example for forming first an initial passivation film by plasma CVD process in the presence of TEOS, Ar gas and $CF_4$ gas and then forming thereon a passivation film by plasma CVD process in the presence of TEOS and $N_2O$ gas.

After having formed the initial passivation film of $SiO_2$ on the surface of the substrate, the latter passivation film of $SiO_2$ was formed on the surface of the initial passivation film in the same manner as in the above-described Example 2 except for the fact that a mixture gas obtained by adding 5% by volume of $CF_4$ gas to Ar gas was used as the reactive gas for forming the initial passivation film, that the partial pressure of the mixture gas was made to be 90 Pa, that $N_2O$ gas was used as the reactive gas for forming the latter passivation film, and that the partial pressure of the $N_2O$ gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation of the initial protection film was 50 nm/min and that of the latter protection film was 40 nm/min.

EXAMPLE 12

This is an example for forming a passivation film by plasma CVD process in the presence of TEOS and Ar gas.

A passivation film of $SiO_2$ was formed on the surface of the substrate in the same manner as in the above-described Example 1 except for the fact that an acrylic resin was used as the resin material for the substrate.

Upon checking the surface of the substrate after the film formation, an $SiO_2$ film was found to have been formed uniformly on the surface of the substrate to a thickness of 2 μm without the surface of the substrate being ashed. The speed of film formation was 40 nm/min.

EXAMPLE 13

This is an example for forming a passivation film on a polycarbonate (plastic) substrate by plasma CVD process in the presence of TEOS and He gas.

A passivation film of $SiO_2$ was formed on the surface of the substrate in the same manner as in the above-described Example 1 except for the fact that a polycarbonate (plastic) was used as the plastic material for the substrate, that He gas was used as the reactive gas, and that the partial pressure of the He gas was made to be 90 Pa.

Upon checking the surface of the substrate after the film formation, an $SiO_2$ film was found to have been formed uniformly on the surface of the substrate to a thickness of 2 μm without the surface of the substrate being subjected to ashing. The speed of film formation was 40 nm/min.

EXAMPLE 14

This is an example for forming a passivation film on an epoxy-based resin (substrate) by plasma CVD process using TMOS (tetramethyl orthosilicate: $Si(OCH_3)_4$) as a raw gas in the presence of TMOS and $NH_3$ gas.

A passivation film of $SiO_2$ was formed on the surface of the substrate in the same manner as in the above-described Example 1 except for the fact that TMOS was used as the raw gas, that $NH_3$ was used as the reactive gas, and that the partial pressure of $NH_3$ was made to be 90 Pa.

Upon checking the surface of the substrate after the film formation, an $SiO_2$ film was found to have been formed uniformly on the surface of the substrate to a thickness of 2 $\mu$m without the surface of the substrate being subjected to ashing. The speed of film formation was 40 nm/min.

As described hereinabove, according to the present invention, when the passivation film of $SiO_2$ is formed by plasma CVD process on the surface of the substrate by decomposing the raw gas, one of Ar, He and $NH_3$ gases was used as the reactive gas which serves as an auxiliary for decomposing the raw gas. Therefore, a good passivation film of $SiO_2$ of uniform thickness can be formed in conformity with the shape of the surface of the substrate, without the surface of the substrate being subjected to ashing.

Further, the speed of film formation can be increased by adding a fluorine group gas such as $CF_4$ and $NF_3$ to the reactive gas.

In case an initial passivation film of $SiO_2$ is first formed by plasma CVD process by decomposing the raw gas by using one of Ar, He and $NH_3$ as a reactive gas to serve as an auxiliary in decomposing the raw gas, and then a latter passivation film of $SiO_2$ is formed on top of the initial passivation film by plasma CVD process by decomposing the raw gas by using an oxidizing gas, such as $O_2$, $N_2O$ or $O_3$, or $H_2$ gas as the reactive gas, the surface of the substrate is not subjected to ashing and a passivation film which is equal to the conventionally obtained passivation film of $SiO_2$ can be obtained, without causing ashing to take place on the surface of the substrate.

It is readily apparent that the above-described method of forming a passivation film meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A method of forming an $SiO_2$ passivation film on a surface of a plastic substrate by a plasma chemical vapor deposition process wherein an organic oxysilane is used as a raw gas, which comprises using tetraethoxysilane or tetramethoxysilane as the organic oxysilane and using a gas selected from the group consisting of Ar, He and $NH_3$ as a reactive gas which serves as an auxiliary for decomposing the raw gas at a temperature not greater than the thermal deformation temperature of the substrate in the absence of a gas having an ashing effect, whereby ashing of the substrate by oxygen or hydrogen radicals is prevented.

2. A method according to claim 1, wherein said temperature is lower than about 250° C.

3. A method according to claim 1, wherein the plastic is an epoxy, polycarbonate, acrylonitrile-butadiene-styrene or acrylic resin.

4. A method of forming an $SiO_2$ passivation film according to claim 3, wherein said temperature is lower than about 250° C.

5. A method according to any one of claims 1 through 4, wherein a fluorine-containing gas is added to the reactive gas.

6. A method according to claim 5, wherein the fluorine-containing gas is $CF_4$ or $NF_3$.

* * * * *